United States Patent
Chang et al.

(10) Patent No.: US 9,864,275 B2
(45) Date of Patent: Jan. 9, 2018

(54) LITHOGRAPHIC RESIST WITH FLOATING PROTECTANT

(71) Applicant: Taiwan Semiconductor Manufacturing Company, Ltd., Hsin-Chu (TW)

(72) Inventors: Ching-Yu Chang, Hsin-Chu (TW); Chien-Wei Wang, Zhubei (TW); Hsueh-An Chen, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/632,793

(22) Filed: Feb. 26, 2015

(65) Prior Publication Data
US 2016/0254142 A1    Sep. 1, 2016

(51) Int. Cl.
*G03F 7/004* (2006.01)
*G03F 7/11* (2006.01)
(Continued)

(52) U.S. Cl.
CPC .............. *G03F 7/11* (2013.01); *C08F 220/22* (2013.01); *C08F 220/24* (2013.01);
(Continued)

(58) Field of Classification Search
CPC . G03F 7/004; G03F 7/11; G03F 7/325; G03F 7/2041; G03F 7/0046;G03F 7/0758; C08L 33/16; C08L 2205/025; C08F 220/38; C08F 220/26; C08F 220/22; C08F 220/24; H01L 21/0274; H01L 21/3081
(Continued)

(56) References Cited

U.S. PATENT DOCUMENTS 7,193,023 B2 *  3/2007  Allen ................... G03F 7/0397
                                                          430/270.1
8,017,303 B2 *  9/2011  Goldfarb .............. C08F 220/22
                                                          430/270.1
(Continued)

FOREIGN PATENT DOCUMENTS

JP    2009251328    10/2009
JP    2013257582    12/2013
(Continued)

OTHER PUBLICATIONS

Office Action dated Nov. 8, 2016 from Korean Intellectual Property Office for corresponding Korean Application No. 10-2015-0164999, 15 pages.

*Primary Examiner* — Amanda C Walke
(74) *Attorney, Agent, or Firm* — Haynes and Boone, LLP

(57) ABSTRACT

An improved resist material and a technique for patterning a workpiece such as an integrated circuit workpiece that offers improved resistance to environmental contaminants is provided. In an exemplary embodiment, the method includes receiving a workpiece and applying to the workpiece a resist material containing a protectant disbursed throughout. A thermal process is performed on the workpiece that causes the protectant to become concentrated in an upper region of the resist material. The resist material is exposed in a lithographic process and the exposed resist material is developed to define a pattern within the resist material. In some such examples, the protectant is selected to reduce an effect of an environmental contaminant without affecting an acid/base ratio of the resist material. In some such embodiments, the protectant includes a hydrophobic functional group.

18 Claims, 4 Drawing Sheets

(51) Int. Cl.

| | |
|---|---|
| *H01L 21/027* | (2006.01) |
| *G03F 7/20* | (2006.01) |
| *G03F 7/16* | (2006.01) |
| *G03F 7/32* | (2006.01) |
| *G03F 7/075* | (2006.01) |
| *C08F 220/38* | (2006.01) |
| *C08L 33/16* | (2006.01) |
| *C08F 220/26* | (2006.01) |
| *H01L 21/308* | (2006.01) |
| *C08F 220/22* | (2006.01) |
| *C08F 220/24* | (2006.01) |

(52) U.S. Cl.
CPC .......... *C08F 220/26* (2013.01); *C08F 220/38* (2013.01); *C08L 33/16* (2013.01); *G03F 7/004* (2013.01); *G03F 7/0046* (2013.01); *G03F 7/0758* (2013.01); *G03F 7/168* (2013.01); *G03F 7/20* (2013.01); *G03F 7/2041* (2013.01); *G03F 7/325* (2013.01); *H01L 21/0274* (2013.01); *H01L 21/3081* (2013.01); *C08L 2205/025* (2013.01)

(58) Field of Classification Search
USPC ......... 430/270.1, 271.1, 322, 325, 329, 330, 430/331, 434, 435, 905, 913; 526/245, 526/279, 328, 309
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,592,137 B2 | 11/2013 | Chang et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2006/0246373 A1* | 11/2006 | Wang | G03F 7/0046 430/270.1 |
| 2009/0239176 A1* | 9/2009 | Kanda | G03F 7/0046 430/285.1 |
| 2011/0300483 A1* | 12/2011 | Cheng | G03F 7/0752 430/272.1 |
| 2012/0034558 A1* | 2/2012 | Chang | G03F 7/0046 430/270.1 |
| 2012/0122030 A1* | 5/2012 | Wang | G03F 7/0046 430/270.1 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0256146 A1 | 9/2014 | Chien et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

FOREIGN PATENT DOCUMENTS

| | | |
|---|---|---|
| KR | 100243738 B1 | 3/2000 |
| KR | 100249885 B1 | 3/2000 |

\* cited by examiner

LITHOGRAPHIC RESIST WITH FLOATING PROTECTANT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, advances in lithography have been important to reducing device size. In general, lithography is the formation of a pattern on a target. In one type of lithography, referred to as photolithography, radiation such as ultraviolet light passes through or reflects off a mask before striking a photoresist coating on the target. The photoresist includes one or more components that undergo a chemical transition when exposed to radiation. A resultant change in property allows either the exposed or the unexposed portions of the photoresist to be selectively removed. In this way, photolithography transfers a pattern from the mask onto the photoresist, which is then selectively removed to reveal the pattern. The target then undergoes processing steps that take advantage of the shape of the remaining photoresist to create features on the target. Another type of lithography, referred to as direct-write lithography, uses a laser, an electron beam (e-beam), ion beam, or other narrow-focused emission to expose a resist coating or to pattern a material layer directly. E-beam lithography is one of the most common types of direct-write lithography, and, by directing a collimated stream of electrons to the area to be exposed, can be used to remove, add, or otherwise change a resist or other material with remarkable accuracy.

Because of the manner in which the resist pattern defines the features to be formed, feature quality depends heavily on the ability of the resist to form edges at boundaries between exposed and unexposed areas that are both precise and stable. In contrast, irregular resist edges may lead to narrowing, necking, bridging and other feature defects. In this way and others, resist performance directly affects critical dimension (CD) and other measurements of feature size and quality. While existing resists have been generally adequate, additional improvements hold the potential to produce smaller circuits and to improve fabrication yield.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
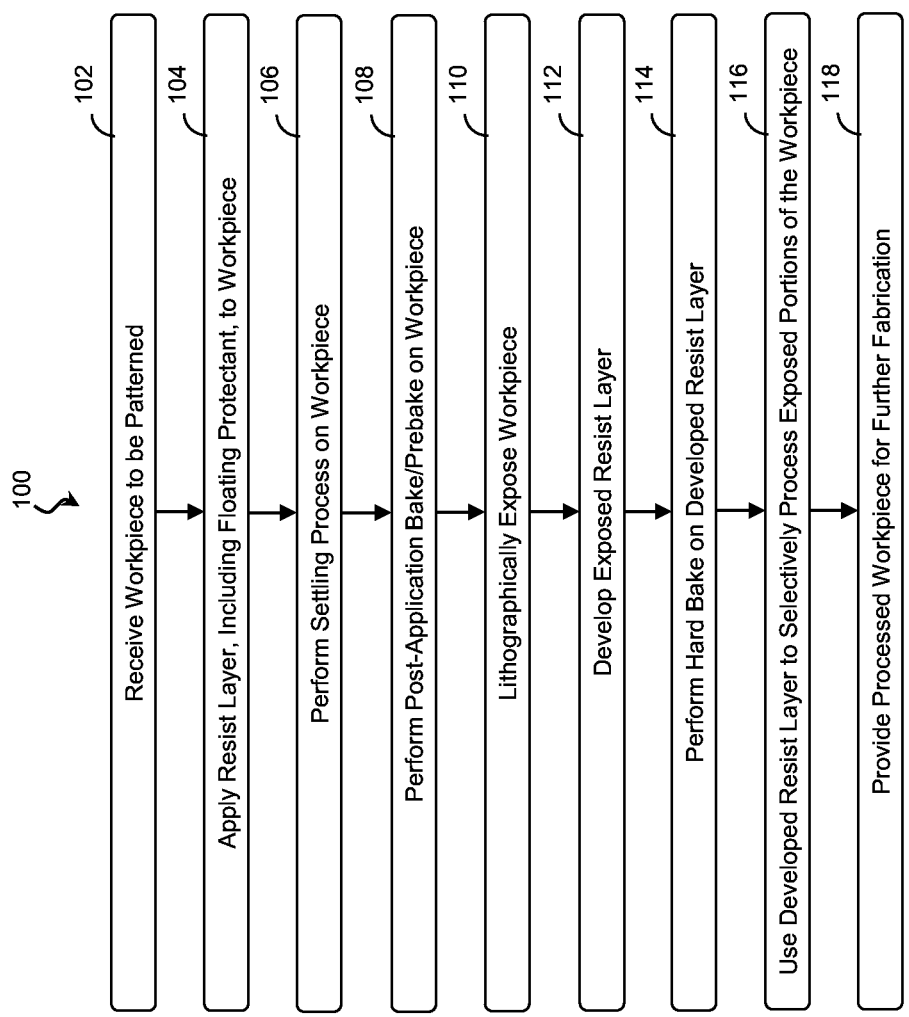
FIG. 1 is a flow diagram of a method for patterning a workpiece using a resist with a floating protectant according to various aspects of the present disclosure.

The present disclosure relates generally to IC device manufacturing and, more particularly, to a resist that includes a protectant against contamination and a technique for lithographically patterning a workpiece using the resist to form a set of features.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates to the patterning of a workpiece, such as a semiconductor substrate, using lithography. The techniques of the present disclosure apply equally to a wide range of lithographic techniques, including photolithography and direct-write lithography. Each type of lithographic technique may have a characteristic energy (e.g., ultraviolet radiation, electron beam, ion beam, etc.), and depending on the lithographic technique, a lithographic resist encompasses any resist material sensitive to the respective energy.

Figure 2:
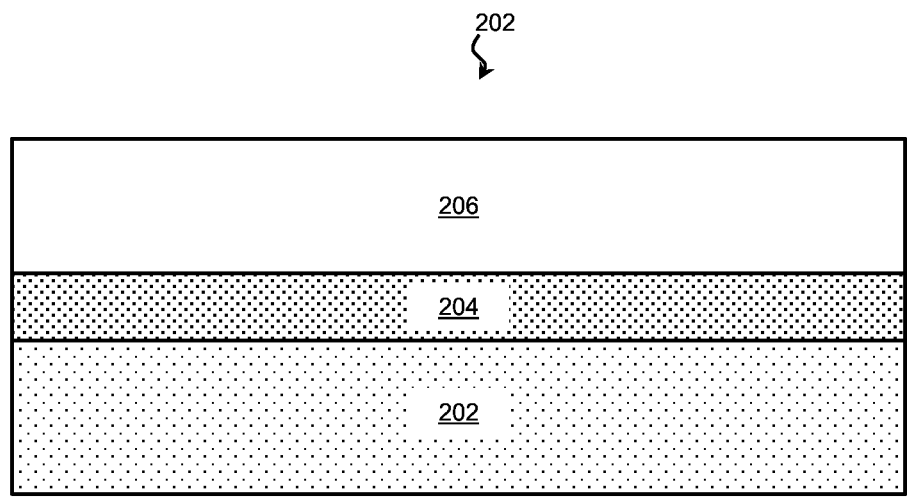
FIGS. 2 and 3 are cross-sectional views of a portion of the workpiece undergoing the patterning method according to various aspects of the present disclosure.
Figure 3:
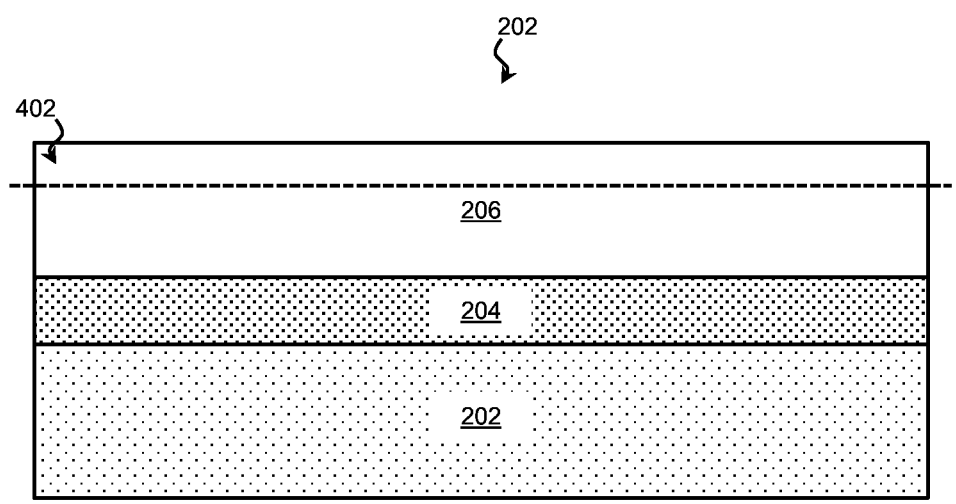
Figure 4A:
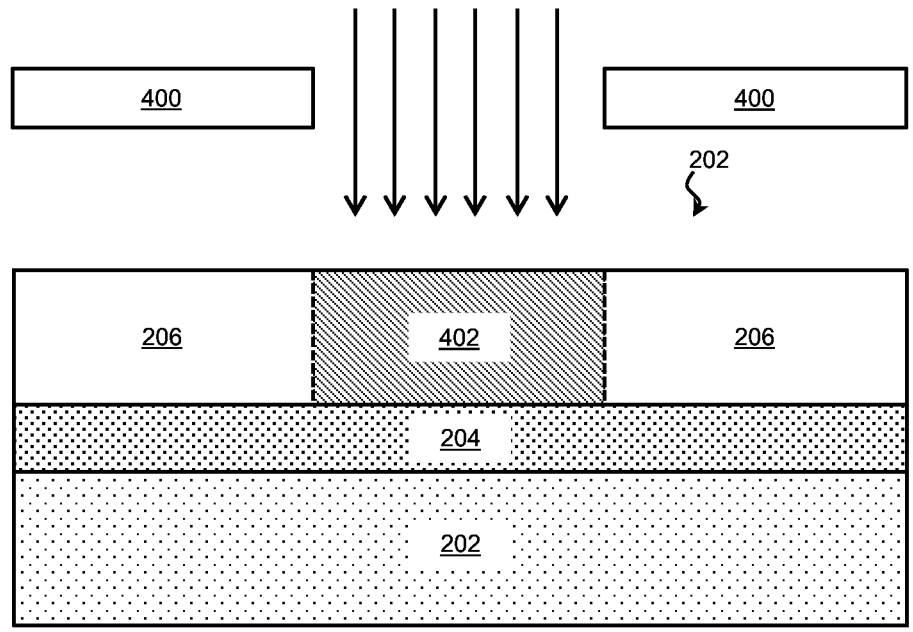
FIG. 4A is a cross-sectional view of portion of the workpiece having the floating protectant after a lithographic exposure according to various aspects of the present disclosure.
Figure 4B:
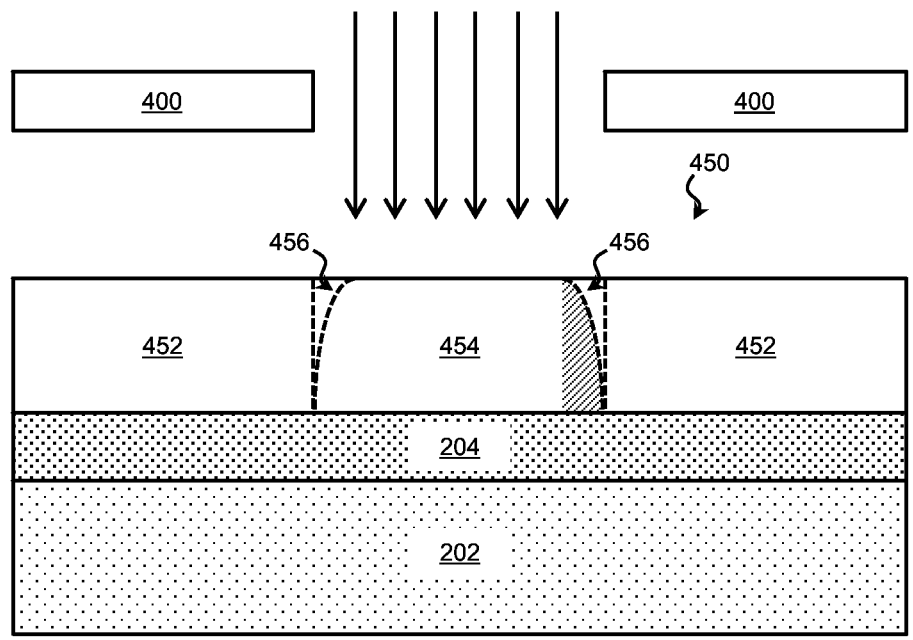
FIG. 4B is a cross-sectional view of portion of an alternate workpiece having a resist without a protectant after a lithographic exposure according to various aspects of the present disclosure.
Figure 5:
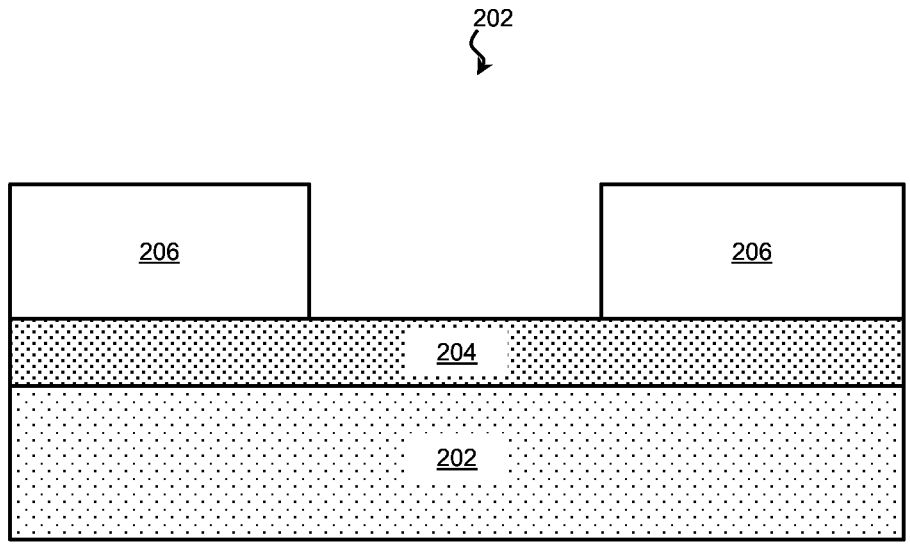
FIGS. 5 and 6 are cross-sectional views of a portion of the workpiece having the floating protectant undergoing the patterning method according to various aspects of the present disclosure.
Figure 6:
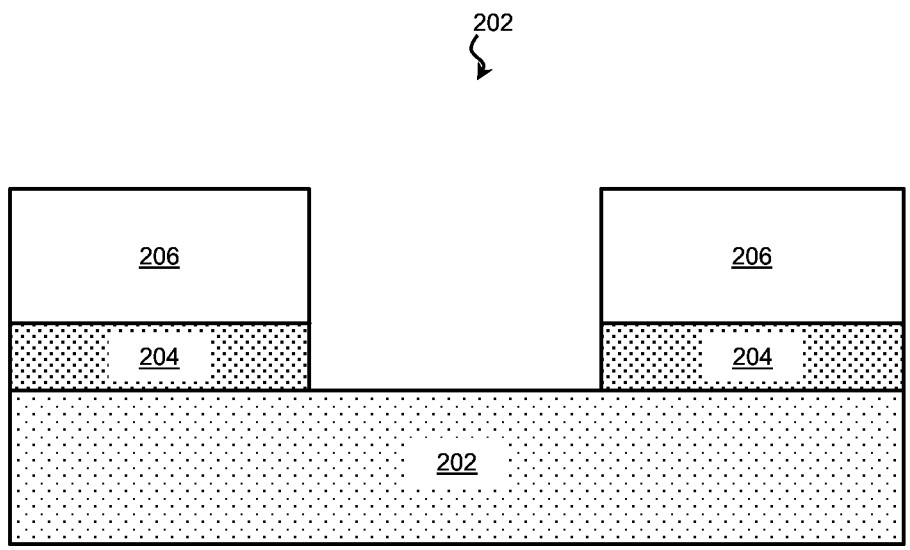

In the embodiments that follow, a lithographic resist and a corresponding technique for lithographic patterning are described with reference to FIGS. 1-6. As explained in more detail below, incorporating a protectant into the resist reduces contamination by compounds that might otherwise disrupt the reaction. In this way, the resist and the associated technique provide improved pattern fidelity and resolution. FIG. 1 is a flow diagram of a method 100 for patterning a workpiece 200 using a resist with a floating protectant according to various aspects of the present disclosure. It is understood that additional steps can be provided before, during, and after the method 100 and that some of the steps described can be replaced or eliminated for other embodiments of the method 100. FIGS. 2 and 3 are cross-sectional views of a portion of the workpiece 200 undergoing the patterning method according to various aspects of the present disclosure. FIG. 4A is a cross-sectional view of portion of the workpiece 200 having the resist including the floating protectant after a lithographic exposure according to various aspects of the present disclosure. For comparison, FIG. 4B is a cross-sectional view of portion of an alternate workpiece 450 having a resist without a protectant after a lithographic exposure according to various aspects of the present disclosure. FIGS. 5 and 6 are cross-sectional views of a portion of the workpiece 200 having the floating protectant undergoing the patterning method according to various aspects of the present disclosure. For clarity and ease of explanation, some elements of the figures have been simplified.

Referring to block 102 of FIG. 1 and to FIG. 2, a workpiece 200 is received for patterning. The exemplary workpiece 200 includes a substrate 202 upon which other materials may be formed. In various examples, the substrate 202 comprises an elementary (single element) semiconductor, such as germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 202 may include various doped regions (e.g., p-type wells or n-type wells), such as source/drain regions. The doped regions may be doped with p-type dopants, such as phosphorus or arsenic, and/or n-type dopants, such as boron or $BF_2$, depending on design requirements. The doped regions may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the doped regions include halo/pocket regions that can reduce short channel effects (e.g., punch-through effects) and may be formed by tilt-angle ion implantation or other suitable technique.

The substrate 202 may also include various material layers formed upon it. For example, in the illustrated embodiment, the workpiece 200 includes a material layer 204 to be patterned. Material layer 204 is representative of any layer or layers that may be used in the course of integrated circuit fabrication. For example, material layer 204 may include a conductive layer, a semiconductor layer, a dielectric layer, and/or other layers and may be distinct from the substrate 202 or incorporated into it. In some such examples, the material layer 204 is a hard mask layer and includes a dielectric such as a semiconductor oxide, a semiconductor nitride, a semiconductor oxynitride, and/or a semiconductor carbide. A hard mask material layer 204 may be used to process underlying regions of the workpiece 200, and is particularly well suited to applications where a resist might not withstand the processing of the underlying layer. The material or materials of a hard mask material layer 204 may be selected based on their stability as well as their etchant sensitivity relative to surrounding materials.

Referring to block 104 of FIG. 1 and referring still to FIG. 2, a resist layer 206 is applied to the workpiece 200. The resist layer 206 represents any lithographically sensitive resist material, and in many embodiments, the resist layer 206 includes a photoresist material sensitive to radiation such as UV light, deep ultraviolet (DUV) radiation, and/or EUV radiation. However, the principles of the present disclosure apply equally to e-beam resists and other direct-write resist materials. The resist layer 206 may be applied by any suitable technique, and an exemplary embodiment, the resist layer 206 is applied in a liquid form using a spin-on (i.e., spin coating) technique. Spin coating may use centrifugal force to disperse the resist layer 206 in a liquid form across the surface of the workpiece 200 in a uniform thickness. To facilitate application, the resist layer 206 may include a solvent, which when removed, leaves the resist layer 206 in a solid or semisolid form. The solvent may be driven off as part of the spin coating, during a settling process, and/or during a post-application/pre-exposure baking (i.e., prebake) process.

Regarding its composition, the resist layer 206 may include one or more photosensitive materials. For example, the resist layer 206 may include a photo-acid generator (PAG) that, as the name implies, generates an acid within those portions of the resist layer 206 exposed to radiation. A polymer within the resist layer 206, such as an acid-cleavable polymer or acid cross-linkable polymer, is sensitive to this generated acid, causing the portion of the polymer in the exposed regions to undergo a chemical reaction. The resist layer 206 may also include a photobase generator (PBG) and/or photo-decomposable quencher (PDQ) to reduce acid concentration in unexposed or marginally-exposed regions of the resist layer 206 and thereby inhibit the chemical reaction of the polymer in these regions. In some embodiments, the resist layer 206 also includes one or more chromophores, solvents, and/or surfactants.

Because some resist layer 206 compositions are highly sensitive to the acid/base ratio, environmental contaminants that affect the acid/base balance may noticeably affect the quality of the resulting pattern. For example, in some applications, the resist layer 206 is exposed to amines that react with and inhibit acids in the resist. As a result, some exposed areas of the resist layer 206, particularly those at a boundary between an exposed region and an unexposed region, may not contain sufficient acid to transform the polymer. In turn, this may cause edge distortions in the developed resist layer 206. To reduce or prevent contamination, the resist layer 206 may include a protectant material. The protectant may be configured to protect the resist from the effects of the contaminants and may do so without affecting the acid/base ratio. For example, differences in water affinity between a hydrophobic protectant and hydrophilic contaminants (or vice-versa) may be used to repel such contaminants without altering the function of the resist layer 206. Accordingly, the protectant may have one or more hydrophobic or hydrophilic functional groups based, in part, on the nature of the contaminants to be repelled. The protectant may be added in any concentration, and in various examples, the protectant ranges from about 0.1% to about 30% of the total weight of the combined resist material. In a subset of these examples, the protectant ranges from about 3% to about 15% of the total weight of the combined resist material. The protectant may be added to the resist material during its manufacture, immediately before applying the resist material to the workpiece 200, or any time there between.

Because the topmost surface of the resist layer 206 may have the greatest exposure to contaminants, it may be beneficial for the protectant to be concentrated in the topmost regions. Accordingly, in some embodiments, while the protectant is mixed in even concentration at the time of application, the protectant rises to the top of the liquid or semisolid resist layer 206 after application. For example, in some such embodiments, a molecular weight difference between the protectant and other components of the resist causes the protectant to float to the top region of the resist layer 206. In some embodiments, a polarity difference causes the protectant to rise to the top region of the resist layer 206. Similarly, in some embodiments, different degrees of water affinity cause the protectant to rise to the top region. In some embodiments, the protectant's higher solubility in the solvent causes the protectant to rise to the top region. In some embodiments, the protectant's solubility (or lack thereof) in the polymer of the resist causes the protectant to rise to the top region. It is understood that none of these properties are exclusive, and the resist layer 206 may leverage any, all, or none of these properties to concentrate the protectant in the top region. Due to the tendency of the protectant to rise to the surface of the resist layer 206, the protectant may be considered to be "floating" in the resist layer 206.

The resist layer 206 may include any suitable protectant. In some exemplary embodiments, the protectant includes a polymer chain of the form:

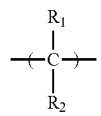

where the repeating segment may repeat any suitable number of times, and $R_1$ and $R_2$ are independent chemical structures. Each of $R_1$ and $R_2$ may include an aromatic carbon ring, an alkene, and/or an alkyne with typical carbon numbers between about 1 and about 50, although in some embodiments, the alkene and/or alkyne includes higher numbers of carbons. Additionally or in the alternative, $R_1$ and $R_2$ may include a straight or cyclic alkyl, alkoxyl, fluoroalkyl, fluoroalkoxyl, epoxyl, and/or amine group. Other suitable components for $R_1$ and $R_2$ include halides, —H, —OH, —Cl, —Br, —I, —NO$_2$, —SO$_3$, —CN, —NCO, —OCN, —CO$_2$, —COOH, and/or —OH. In some embodiments, one or both of $R_1$ and $R_2$ include a group of the form: —OR*, —OC(O)CR*, —SR*, —SO$_2$N(R*)$_2$, —SO$_2$R*, —SOR*, —OC(O)R*, —C(O)OR*, —C(O)R*, —Si(OR*)$_3$, and/or —Si(R*)$_3$ where R* is one of: H or a branched or unbranched, cyclic or noncyclic, saturated or unsaturated, alkyl, alkenyl, or alkynyl group. In various examples, the molecular weight of the protectant polymer may be between about 1000 and about 3000.

The protectant may also include a polymer chain of the form:

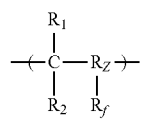

where the repeating segment may repeat any suitable number of times, where $R_1$, $R_2$, $R_Z$, and $R_f$ are independent chemical structures, and where $R_1$ and $R_2$ may be substantially as described above. $R_Z$ may include an aromatic carbon ring, an alkene, and/or an alkyne. In some embodiments, $R_Z$ may include a straight or cyclic alkyl, alkoxyl, fluoroalkyl, and/or fluoroalkoxyl group. Similarly, $R_f$ may include a straight, branched, or cyclic, saturated or non-saturated fluoroalkyl group. Other suitable components for $R_Z$ and $R_f$ include —Cl, —Br, —I, —NO$_2$, —SO$_3$, —CN, —NCO, —OCN, —CO$_2$, —COOH, and/or —OH. In some embodiments, one or both of $R_Z$ and $R_f$ include a group of the form: —OR*, —OC(O)CR*, —SR*, —SO$_2$N(R*)$_2$, —SO$_2$R*, —SOR*, —OC(O)R*, —C(O)OR*, —C(O)R*, —Si(OR*)$_3$, and/or —Si(R*)$_3$ where R* is one of: H or a branched or unbranched, cyclic or noncyclic, saturated or unsaturated, alkyl, alkenyl, or alkynyl group. In various examples, the molecular weight of the protectant may be between about 1000 and about 3000.

Referring to block 106 of FIG. 1 and to FIG. 3, the workpiece 200 may undergo a settling process that allows the protectant to rise to the upper region of the resist layer 206. The settling process may also drive off some of the solvent. In the illustrated embodiment of FIG. 3, the settling process concentrates the protectant in the upper 25% of the resist layer (indicated by reference marker 402). However, in contrast to the subsequent prebake, which may further concentrate the protectant in the upper region 402 and further remove the solvent, the settling process may be performed at a lower temperature to avoid solidifying the resist layer 206 before the protectant has risen to the upper region 402 of the resist layer 206. In an exemplary embodiment, the workpiece 200 is maintained at a suitable temperature for at least an hour as part of the settling process before further processing. The settling process may be performed at an ambient temperature (i.e., room temperature) or at an elevated temperature, although the elevated temperature may be lower than a prebake temperature (e.g., lower than about 90° C.).

Referring to block 108 of FIG. 1 and referring still to FIG. 3, a post-application bake or prebake process is performed on the workpiece 200. The prebake may further concentrate the protectant in the upper region 402 of the resist layer 206. In the illustrated embodiment, the prebake concentrates the protectant such that the majority of the protectant is located in the upper region 402 (upper 25%) upon completion of the prebake. The prebake process may also cause some or all of the remaining solvent to escape from the resist layer 206. The prebake may be performed at any suitable temperature and in an exemplary embodiment includes heating the workpiece 200 to a temperature greater than 90° C. In another exemplary embodiment, the prebake includes heating the workpiece 200 to about 90° C. using a hotplate.

Referring to block 110 of FIG. 1 and to FIG. 4A, a lithographic exposure is performed on the workpiece 200 that exposes selected regions (e.g., region 402) of the resist layer 206 to radiation. Suitable radiation includes UV light, deep ultraviolet (DUV) radiation, and/or EUV radiation. In mask-based photolithographic techniques, a mask 400 absorbs radiation that would otherwise expose regions of the resist layer 206 to be protected while directing radiation towards those regions 402 to be exposed. For example, the mask 400 of FIG. 4A is a simplified representation of a transmissive mask containing a pattern of absorptive regions that block radiation from reaching the resist layer 206 and transmissive regions that allow radiation to reach the resist layer 206. Mask 400 is also representative of a reflective mask containing a pattern of absorptive regions that block radiation and reflective regions that reflect radiation for projection onto the workpiece 200. Furthermore, the principles of the present disclosure may be extended to e-beam or ion beam resist layers 206. In such embodiments, a direct write process such an e-beam or ion beam exposure is performed in block 110 to expose selected regions of the resist layer 206.

The exposure of block 110 causes a chemical reaction to occur in the exposed regions 402 of the resist layer 206. For example, the exposure radiation may cause a PAG with in the exposed region 402 to produce an acid that reacts with a polymer in the resist layer 206. In the illustrated example of FIG. 4A, the exposed region 402 is shaded to indicate increased acid concentration and the resultant chemical reaction. Because of the protectant, the acid concentration in the exposed region 402 may be relatively consistent throughout.

In contrast to the example of FIG. 4A in which the resist layer 206 includes the protectant, FIG. 4B illustrates a workpiece 450 in which the resist layer 452 lacks a protectant and in which an environmental pollutant (e.g., an amine or other alkaline pollutant) reduces the concentration of acid by neutralizing it or inhibiting its generation. In FIG. 4B, a first portion 454 of an exposed region of the resist 452 having increased acid concentration is shaded, while a second portion 456 of the exposed region where the generated acid is inhibited is shown without shading. As can be seen, some of the exposed resist layer 452 does not exhibit the increased acid associated with exposure. This result may be particularly profound at the top of the resist layer 452 because this portion of the resist layer 452 may have the greatest exposure to environmental contaminants. Developing the resist layer 452 of FIG. 4B will result in an irregular pattern edge that may adversely affect the patterning of the underlying material layer 204. For example, in an aqueous base development process used to develop a positive resist, an undesirable reduction in CD (critical dimension) has been observed, while in an organic solvent development process used to develop a negative resist, an undesirable increase in CD has been observed. However, the introduction of the above-described protectant into the resist layer 206 has been determined to reduce and even eliminate this effect.

Referring to block 112 of FIG. 1 and to FIG. 5, a developing process is performed on the workpiece 200 of FIG. 4A. The developing process dissolves or otherwise removes either the exposed regions in the case of a positive resist development process or the unexposed regions in the case of a negative resist development process. The developing process may begin with a post-exposure bake. Depending on the polymer included in the resist layer 206, the post-exposure bake may catalyze a reaction between the generated acid and the polymer. For example, the post-exposure bake may accelerate a cleaving or cross-linking of the polymer caused by the generated acid. Following the optional post-exposure bake, a developer is applied to the workpiece 200 that removes the particular regions of the resist layer 206. Suitable positive developers include TMAH (tetramethyl ammonium hydroxide), KOH, and NaOH, and suitable negative developers include solvents such as n-butyl acetate, ethanol, hexane, benzene, and toluene. After developing the workpiece 200, the developed resist layer 206 may be rinsed.

Referring to block 114 of FIG. 1, a hard bake is performed on the workpiece 200 to further stabilize the pattern of the resist layer 206. Referring to block 116 of FIG. 1 and to FIG. 6, the patterned resist layer 206 is used to selectively process the underlying material layer 204. In the example of FIG. 6, this process includes etching the underlying material layer 204. The pattern formed in the resist layer 206 allows exposed areas of the material layer 204 to be selectively etched. However, it is understood that the concepts of the present disclosure apply to any fabrication process performed on the underlying material layer 204. For example, any suitable etching process, deposition process, implantation process, epitaxy process, and/or any other fabrication process may be performed on the underlying material layer 204. In various examples, the patterned material layer 204 is used to fabricate a gate stack, to fabricate an interconnect structure, to form non-planar devices by etching to expose a fin or by epitaxially growing fin material, and/or other suitable applications. The remaining resist layer 206 may be removed after the underlying material layer 204 is processed.

Referring to block 118 of FIG. 1, the workpiece 200 may then be provided for subsequent fabrication processes. For example, the workpiece 200 may be used to fabricate an integrated circuit chip, a system on a chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Thus, the present disclosure provides a technique for forming features on a workpiece that offers improved resistance to environmental contaminants. In some embodiments, the provided method includes receiving a workpiece and applying, to the workpiece, a resist material containing a protectant disbursed throughout. A thermal process is performed on the workpiece that causes the protectant to become concentrated in an upper region of the resist material. The resist material is exposed in a lithographic process and the exposed resist material is developed to define a pattern within the resist material. A portion of the workpiece is selectively processed based on the pattern of the resist material. In some such embodiments, the method also includes performing a settling process on the workpiece that also causes the protectant to become concentrated in the upper region of the resist material. In some such embodiments, the protectant includes least one of: an aromatic carbon ring, an alkene functional group, or an alkyne functional group.

In further embodiments, a lithographic method is provided that includes receiving a substrate and applying a resist containing a protectant to the substrate. After applying the resist, a top region of the resist opposite the substrate has a first concentration of the protectant. Thereafter, a process is performed that causes a concentration of the protectant in the top region to increase from the first concentration to a second concentration. A lithographic exposure of the resist is performed to define a pattern therein, and an exposed portion of the substrate is processed using the pattern defined in the exposed resist. In some such embodiments, the protectant includes a hydrophobic functional group. In some such embodiments, the protectant is selected such that at least one of: a molecular weight difference, a polarity difference, a water affinity difference, a difference in solubility in a solvent of the resist material, or a difference in solubility in a polymer of the resist causes the protectant to become concentrated in the top region of the resist.

In yet further embodiments, a lithographic resist material is provided that includes a photosensitive material, a polymer, and a protectant configured to increase in concentration at a topmost region of the lithographic resist material after application. In some such embodiments, the protectant includes a polymer chain of the form:

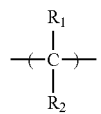

where each of $R_1$ and $R_2$ includes one of: an aromatic carbon ring, an alkene group, an alkyne group, an alkyl group, an alkoxyl group, a fluoroalkyl group, a fluoroalkoxyl group, an epoxyl group, an amine group, a halide, —H, —OH, —Cl, —Br, —I, —NO$_2$, —SO$_3$, —CN, —NCO, —OCN, —CO$_2$, —COOH, or —OH. In some such embodiments, the protectant includes a polymer chain of the form:

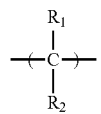

where each of $R_1$ and $R_2$ includes at least one group of the form: —OR*, —OC(O)CR*, —SR*, —SO$_2$N(R*)$_2$, —SO$_2$R*, —SOR*, —OC(O)R*, —C(O)OR*, —C(O)R*, —Si(OR*)$_3$, or —Si(R*)$_3$ and where R* is one of: H, an alkyl group, an alkenyl group, or an alkynyl group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fabrication method comprising:
    receiving a workpiece;
    applying, to the workpiece, a resist material containing a hydrophobic protectant having a fluorine-containing functional group, wherein the hydrophobic protectant having the fluorine-containing functional group is disbursed throughout the resist material;
    performing a thermal process on the workpiece to cause the hydrophobic protectant having the fluorine-containing functional group to become concentrated in an upper region of the resist material, wherein the thermal process includes:
        exposing the workpiece to a first temperature, wherein the first temperature does not solidify the resist material, and
        exposing the workpiece to a second temperature, wherein the second temperature is greater than the first temperature;
    exposing the resist material in a lithographic process, wherein the hydrophobic protectant having the fluorine-containing functional group repels environmental contaminants that affect an acid/base ratio of the resist material during the lithographic process;
    developing the exposed resist material to define a pattern within the resist material; and
    selectively processing a portion of the workpiece based on the pattern of the resist material.

2. The fabrication method of claim 1, wherein the first temperature is less than 90° C., and the second temperature is greater than 90° C.

3. The fabrication method of claim 1, wherein the hydrophobic protectant having the fluorine-containing functional group does not affect the acid/base ratio of the resist material.

4. The fabrication method of claim 1, wherein the hydrophobic protectant having the fluorine-containing functional group inhibits amine pollutants from reacting with the resist material.

5. The fabrication method of claim 1, wherein the fluorine-containing functional group is a fluoroalkyl group or a fluoroalkoxyl group.

6. The fabrication method of claim 1, wherein the hydrophobic protectant having the fluorine-containing functional group includes a polymer chain of the form:

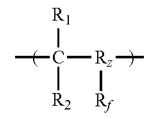

where $R_f$ is a fluoroalkyl group,
$R_z$ is selected from the group consisting of: an alkyl group, an alkoxyl group, a fluoroalkyl group, and a fluoroalkoxyl group, and
each of $R_1$ and $R_2$ is selected from the group consisting of: an aromatic carbon ring, an alkene group, an alkyne group, an alkyl group, an alkoxyl group, a fluoroalkyl group, a fluoroalkoxyl group, an epoxyl group, an amine group, a halide, —H, —OH, —Cl, —Br, —I, —NO$_2$, —SO$_3$, —CN, —NCO, —OCN, —CO$_2$, —COOH, and —OH.

7. The fabrication method of claim 1, wherein the hydrophobic protectant having the fluorine-containing functional group includes a polymer chain of the form:

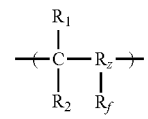

where $R_f$ is a fluoroalkyl group,
$R_z$, is selected from the group consisting of: an alkyl group, an alkoxyl group, a fluoroalkyl group, and a fluoroalkoxyl group,
each of $R_1$ and $R_2$ is selected from the group consisting of: —OR*, —OC(O)CR*, —SR*, —SO$_2$N(R*)$_2$, —SO$_2$R*, —SOR*, —OC(O)R*, —C(O)OR*, —C(O)R*, —Si(OR*)$_3$, and —Si(R*)$_3$,
R* is selected from the group consisting of: H, an alkyl group, an alkenyl group, and an alkynyl group.

8. The fabrication method of claim 1, wherein the hydrophobic protectant having the fluorine-containing functional group is selected such that at least one of: a molecular weight difference, a polarity difference, a water affinity difference, a difference in solubility in a solvent of the resist material, or a difference in solubility in a polymer of the resist material causes the hydrophobic protectant having the fluorine-containing functional group to become concentrated in the upper region of the resist material.

9. The fabrication method of claim 1, wherein the hydrophobic protectant having the fluorine-containing functional group has a molecular weight between about 1000 and about 3000.

10. A lithographic method comprising:
applying a resist layer containing a hydrophobic protectant having a fluorine-containing functional group to a substrate, wherein the hydrophobic protectant having the fluorine-containing functional group does not affect an acid/base ratio of the resist layer and inhibits amine pollutants from reacting with the resist layer and affecting the acid/base ratio of the resist layer;
performing a settling process at a first temperature that does not solidify the resist layer and causes the hydrophobic protectant having the fluorine-containing functional group to rise to a top region of the resist layer opposite the substrate, such that the top region has a first concentration of the hydrophobic protectant having the fluorine-containing functional group;
performing a prebake process at a second temperature that is greater than the first temperature to cause the hydrophobic protectant having the fluorine-containing functional group in the top region to increase from the first concentration to a second concentration;
performing a lithographic exposure of the resist layer to define a pattern therein; and
processing a portion of the substrate using the pattern defined in the resist layer.

11. The lithographic method of claim 10, wherein the top region is an upper 25% of the resist layer, and further wherein the settling process and the prebake process causes a majority of the hydrophobic protectant having the fluorine-containing functional group disbursed in the resist layer when applied to concentrate in the upper 25% of the resist layer.

12. The lithographic method of claim 10, wherein the settling process is performed for at least one hour.

13. The lithographic method of claim 10, wherein the fluorine-containing functional group is a fluoroalkyl group or a fluoroalkoxyl group.

14. The lithographic method of claim 10, wherein the hydrophobic protectant having the fluorine-containing functional group is selected such that at least one of: a molecular weight difference, a polarity difference, a water affinity difference, a difference in solubility in a solvent of the resist layer, or a difference in solubility in a polymer of the resist layer causes the hydrophobic protectant having the fluorine-containing functional group to become concentrated in the top region of the resist layer.

15. The lithographic method of claim 10, wherein the hydrophobic protectant having the fluorine-containing functional group includes a polymer chain of the form:

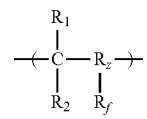

where $R_f$ is a fluoroalkyl group,
$R_z$ is selected from the group consisting of: an alkyl group, an alkoxyl group, a fluoroalkyl group, and a fluoroalkoxyl group, and
each of $R_1$ and $R_2$ is selected from the group consisting of: an aromatic carbon ring, an alkene group, an alkyne group, an alkyl group, an alkoxyl group, a fluoroalkyl group, a fluoroalkoxyl group, an epoxyl group, an amine group, a halide, —H, —OH, —Cl, —Br, —I, —$NO_2$, —$SO_3$, —CN, —NCO, —OCN, —$CO_2$, —COOH, and —OH.

16. A lithographic resist material comprising:
a photosensitive material;
a polymer; and
a hydrophobic protectant having a fluorine-containing functional group that rises to a topmost region of the lithographic resist material during a thermal process that exposes the lithographic resist material to a first temperature that does not solidify the lithographic resist material and a second temperature that is greater than the first temperature, such that the hydrophobic protectant having the fluorine-containing functional group is concentrated in the topmost region of the lithographic resist material, and wherein the hydrophobic protectant having the fluorine-containing functional group does not affect an acid/base ratio of the lithographic resist material and inhibits amine pollutants from reacting with the lithographic resist material and affecting the acid/base ratio of the lithographic resist material during a lithography process.

17. The lithographic resist material of claim 16, wherein the hydrophobic protectant having the fluorine-containing functional group includes a polymer chain of the form:

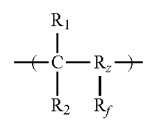

wherein $R_f$ is a fluoroalkyl group,
wherein $R_z$, is selected from the group consisting of: an alkyl group, an alkoxyl group, a fluoroalkyl group, and a fluoroalkoxyl group, and
wherein each of $R_1$ and $R_2$ is selected from the group consisting of: an aromatic carbon ring, an alkene group, an alkyne group, an alkyl group, an alkoxyl group, a fluoroalkyl group, a fluoroalkoxyl group, an epoxyl group, an amine group, a halide, —H, —OH, —Cl, —Br, —I, —$NO_2$, —$SO_3$, —CN, —NCO, —OCN, —$CO_2$, —COOH, and —OH.

18. The lithographic resist material of claim 16, wherein the hydrophobic protectant having the fluorine-containing functional group concentrates in an upper 25% of the lithographic resist material during the thermal process.

* * * * *